(12) United States Patent
Wei et al.

(10) Patent No.: US 8,496,992 B2
(45) Date of Patent: Jul. 30, 2013

(54) METHODS OF FORMING NANOCOMPOSITES CONTAINING NANODIAMOND PARTICLES BY VAPOR DEPOSITION

(75) Inventors: Ronghua Wei, San Antonio, TX (US); Christopher Rincon, San Antonio, TX (US); Kent E. Coulter, Fair Oaks Ranch, TX (US)

(73) Assignee: Southwest Research Institute, San Antonio, TX (US)

( * ) Notice: Subject to any disclaimer, the term of this patent is extended or adjusted under 35 U.S.C. 154(b) by 248 days.

(21) Appl. No.: 12/964,826

(22) Filed: Dec. 10, 2010

(65) Prior Publication Data

US 2012/0148762 A1   Jun. 14, 2012

(51) Int. Cl.
*C23C 16/26* (2006.01)

(52) U.S. Cl.
USPC .......... 427/249.1; 427/249.7; 427/249.8; 427/577

(58) Field of Classification Search
USPC .......... 427/249.1, 249.7, 249.8, 577
See application file for complete search history.

(56) References Cited

U.S. PATENT DOCUMENTS

| | | | | |
|---|---|---|---|---|
| 7,820,130 | B2 * | 10/2010 | Khabashesku et al. | 423/446 |
| 8,252,263 | B2 * | 8/2012 | Sung | 423/446 |
| 2003/0199741 | A1 * | 10/2003 | Martinez | 600/309 |
| 2004/0137229 | A1 * | 7/2004 | Mudholkar et al. | 428/403 |
| 2004/0157005 | A1 * | 8/2004 | Tzeng | 427/571 |
| 2005/0016444 | A1 * | 1/2005 | Franz et al. | 117/68 |
| 2005/0202173 | A1 * | 9/2005 | Mills | 427/249.7 |
| 2007/0065490 | A1 * | 3/2007 | Schaberg et al. | 424/443 |
| 2007/0104551 | A1 * | 5/2007 | Gaiser | 409/132 |
| 2010/0068503 | A1 * | 3/2010 | Neogi et al. | 428/323 |
| 2010/0209665 | A1 * | 8/2010 | Konovalov et al. | 428/141 |
| 2010/0233371 | A1 * | 9/2010 | Kim et al. | 427/290 |
| 2010/0298600 | A1 * | 11/2010 | Lee | 562/523 |
| 2011/0252711 | A1 * | 10/2011 | Chakraborty et al. | 51/298 |
| 2011/0282421 | A1 * | 11/2011 | Sung | 607/118 |
| 2012/0027924 | A1 * | 2/2012 | Castellano | 427/74 |

FOREIGN PATENT DOCUMENTS

WO   WO 2008/035468   *   3/2008

OTHER PUBLICATIONS

Tzeng, Yonhua, "Microwave plasma enhanced chemical vapor deposition of diamond in the vapor of methanol-based liquid solutions." Manuscript presented in the 5th International Conference on the Applications of Diamond and Related Materials (Applied Diamond Conference) held in Tsukuba, Japan on Aug. 31, 1999, pp. 1-7.*
Alkhanishvili, Georgy, et al., "Localization of nanodiamond particles within polypropylene amorphous-crystalline matrix". Citation unavailable—no date or page numbers. Abstract Only.*
Jee, et al., "Surface functionalization and physicochemical characterization of diamond nanoparticles," Current Applied Physics vol. 9, Issue 2, Supplement 1, Mar. 2009, pp. e144-e147; Nano Korea 2008 Symposium.

* cited by examiner

*Primary Examiner* — Bret Chen
(74) *Attorney, Agent, or Firm* — Grossman, Tucker et al

(57) ABSTRACT

A method of coating a substrate, with the method comprising: providing a substrate; dispersing nanodiamond powder in a liquid to provide a coating precursor; converting the liquid of the coating precursor to a vapor; introducing the coating precursor to a vapor deposition process; and operating the vapor deposition process to produce a nanocrystalline diamond-containing nanocomposite coating on the substrate, the nanocomposite coating produced using the coating precursor and comprising the nanodiamond particles.

40 Claims, 5 Drawing Sheets

METHODS OF FORMING NANOCOMPOSITES CONTAINING NANODIAMOND PARTICLES BY VAPOR DEPOSITION

FIELD OF THE INVENTION

The present disclosure relates to nanocomposite material compositions containing nanodiamond particles and the preparation thereof, particularly as coatings on various substrates for a wide range of applications requiring a hard coating on a surface thereof.

BACKGROUND

Diamond may be considered to be a very unique material. It has relatively high hardness, high thermal conductivity, high electric resistivity, a low coefficient of friction and is substantially inert to attacks from most chemicals. For tribological applications, diamond may be considered an excellent material to inhibit erosion, abrasion and sliding wear.

Natural diamond may be considered too expensive and too small in size to protect industrial component surfaces. Similarly, synthetic diamond, which may be used in polishing, grinding and cutting, particularly in machining, mining or oil/natural gas exploration applications, may be difficult to use as a protective coating on components to inhibit erosion, abrasion, wear and corrosion.

It may be possible to form diamond coatings on larger surface areas using a few methods including hot filament chemical vapor deposition (HFCVD) and microwave plasma enhanced chemical vapor deposition (MPECVD). However, such are understood to require high temperature and a limited range of substrate materials. For example, diamond may be deposited on tungsten carbide (WC) for cutting applications. However, due to crystallinity, the coating surface may be quite rough. Consequently, with the exception of cutting applications, diamond coatings may be understood to rarely be used on substrates comprising, for example, steel, titanium (Ti) alloys and aluminum (Al) alloys, as well as substrates for tribological applications.

A coating which may be used as an alternative to diamond is a coating of diamond-like carbon (DLC). A diamond-like carbon coating may be understood herein to be a carbon coating with the amorphous structure, generally containing a high concentration of hydrogen. DLC coatings may be understood to have reasonable hardness, good wear resistance, a relatively low coefficient of friction and are chemically inert. Unlike diamond coatings, however, DLC coatings may be deposited on substrates including steel, titanium (Ti) alloys and aluminum (Al) alloys using a bonding layer, typically of silicon (Si) or silicon carbide (SiC). Silicon may be understood to bond with DLC due to a formation of a thin layer of silicon carbide at the interface between the silicon and DLC.

However, DLC coatings are understood to be useful only to about 400° C., above which temperature graphitization of the carbon may occur. Furthermore, DLC coatings may be understood to be relatively brittle or of low toughness. As a result, DLC coatings are commonly used for low stress sliding wear applications, but not for severe environments including erosion or abrasion under high stress or heavy load.

In light of the foregoing deficiencies, what is needed a coating containing diamond which may offer increased performance, such as use temperature, hardness and toughness, as compared to existing hard coatings. Such coatings may then be applied using manufacturing processes for existing hard coatings and would be applicable to a wide range of substrate materials.

SUMMARY

In one exemplary embodiment, the present disclosure relates to a method of coating a substrate, with the method comprising: providing a substrate; dispersing nanodiamond powder in a liquid to provide a coating precursor; converting the liquid of the coating precursor to a vapor; introducing the coating precursor to a vapor deposition process; and operating the vapor deposition process to produce a nanocrystalline diamond-containing nanocomposite coating on the substrate, the nanocomposite coating produced using the coating precursor and comprising the nanodiamond particles.

In certain embodiments, the nanodiamond particles may have a grain size in a range of and any increment between 1 to 100 nanometers, and more particularly in a range of and any increment between 1 to 10 nanometers.

In certain embodiments, the nanodiamond powder may be dispersed in the liquid in a range of and any increment between 0.001 parts-per-billion to 5,000 parts-per-million by weight of the liquid, more particularly in a range of and any increment between 1 part-per-million to 1000 part-per-million by weight of the liquid; and even more particularly in a range of and any increment between 10 parts-per-million to 100 parts-per-million by weight of the liquid.

In certain embodiments, the nanodiamond particles may agglomerate in the liquid to produce agglomerations of nanodiamond particles, and the agglomerations may have a maximum size of less than or equal to 10 microns.

In certain embodiments, the coating precursor may be a carbon containing precursor, which may be particularly use to provide a coating which may comprise, essentially consist of, or consist of diamond-like carbon.

In certain embodiments, the liquid may comprise, essentially consist of, or consist of hydrocarbons or carbonaceous materials provided by one or more hydrocarbon compounds, such as liquid alkanes, liquid alkenes, liquid aromatics (e.g., toluene) and/or organic alcohols ($C_nH_{2n+1}OH$).

In certain embodiments, the liquid may comprise, essentially consist of, or consist of alcohol provided by one or more alcohol compounds such as methanol ($CH_3OH$).

In certain embodiments, the coating precursor may be a silicon containing precursor, which may be particularly used to provide a coating which may comprise, essentially consist of, or consist of silicon.

In certain embodiments, the liquid may comprise a silicon (Si) containing liquid, which may particularly comprise at least one of silane ($SiH_4$), methylsilane (MS; $CH_3SiH_3$), dimethylsilane (2MS or DMS; $(CH_3)_2$—$SiH_2$), trimethylsilane (3MS; $(CH_3)_3$—$SiH$), tetramethylsilane (TMS; $(CH_3)_4$—Si), hexamethyldisilazane (HMDS or HMDSN; $(CH_3)_3$—$SiNHSi(CH_3)_3$) and hexamethyldisiloxane (HMDSO; $O[Si(CH_3)_3]_2$).

In certain embodiments, the liquid of the coating precursor may be converted to a vapor prior to introducing the coating precursor to the vapor deposition process. The liquid may converted to a vapor at a temperature of 20° to 25° C., or at a temperature above 25° C. with heat.

In certain embodiments, the vapor may be converted to a plasma during the vapor deposition process. The plasma may be generated by at least one of radio frequency discharge, microwave discharge, direct current discharge, pulse direct current discharge, hollow cathode discharge, electron impact ionization via hot filament thermionic emission, arc discharge and magnetron induced discharge.

In certain embodiments, the vapor deposition process may comprise a physical vapor deposition process, and may particularly comprise a plasma-enhanced physical vapor deposition process.

In certain embodiments, the vapor deposition process may comprise a chemical vapor deposition process, and may particularly comprise a plasma-enhanced chemical vapor deposition process.

In certain embodiments, the vapor deposition process comprises at least one of magnetron sputter deposition, cathodic arc evaporation deposition, electron beam evaporation deposition, radio frequency discharge deposition, microwave discharge deposition and pulsed direct current discharge deposition.

In certain embodiments, the nanocomposite coating may comprise amorphous carbon, and more particularly, the amorphous carbon may comprise diamond-like carbon. The diamond-like carbon may or may not contain hydrogen.

In certain embodiments, the nanocomposite coating may comprise at least one of tungsten carbide, chromium carbide and silicon carbide.

In certain embodiments, the nanocomposite coating may comprise at least one of nanocrystalline nitride and amorphous nitride. The nanocrystalline nitride may comprise at least one of titanium nitride (TiN), zirconium nitride (ZrN), chromium nitride (CrN), hafnium nitride (HfN), vanadium nitride (VN), tungsten nitride (WN), tantalum nitride (TaN), titanium aluminum nitride (TiAlN) and titanium aluminum vanadium nitride (TiAlVN). The amorphous nitride may comprise at least one of silicon nitride ($Si_3N_4$) and boron nitride (BN).

In certain embodiments, the nanocomposite coating may comprise at least one of nanocrystalline carbonitride and amorphous carbonitride. The nanocrystalline carbonitride may comprise at least one of titanium carbonitride (TiCN), zirconium carbonitride (ZrCN), chromium carbonitride (CrCN), hafnium carbonitride (HfCN), vanadium carbonitride (VCN), tungsten carbonitride (WCN), tantalum carbonitride (TaCN), titanium aluminum carbonitride (TiAlCN) and titanium aluminum vanadium carbonitride (TiAlVCN). The amorphous carbonitride may comprise silicon carbonitride (SiCN).

In certain embodiments, the nanocomposite coating comprises nanocrystalline nitride and a metal that is not a nitride or carbide former. The nanocrystalline nitride may comprise at least one of titanium nitride (TiN), zirconium nitride (ZrN), chromium nitride (CrN), hafnium nitride (HfN), vanadium nitride (VN), tungsten nitride (WN), tantalum nitride (TaN), titanium aluminum nitride (TiAlN) and titanium aluminum vanadium nitride (TiAlVN). The metal that is not a nitride or carbide former may comprise copper.

In certain embodiments, the nanocomposite coating may comprise nitride, carbonitride and a metal that is not a nitride or carbide former.

In certain embodiments, the nanocomposite coating may comprise the nanodiamond particles dispersed in an amorphous carbon matrix.

FIGURES

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
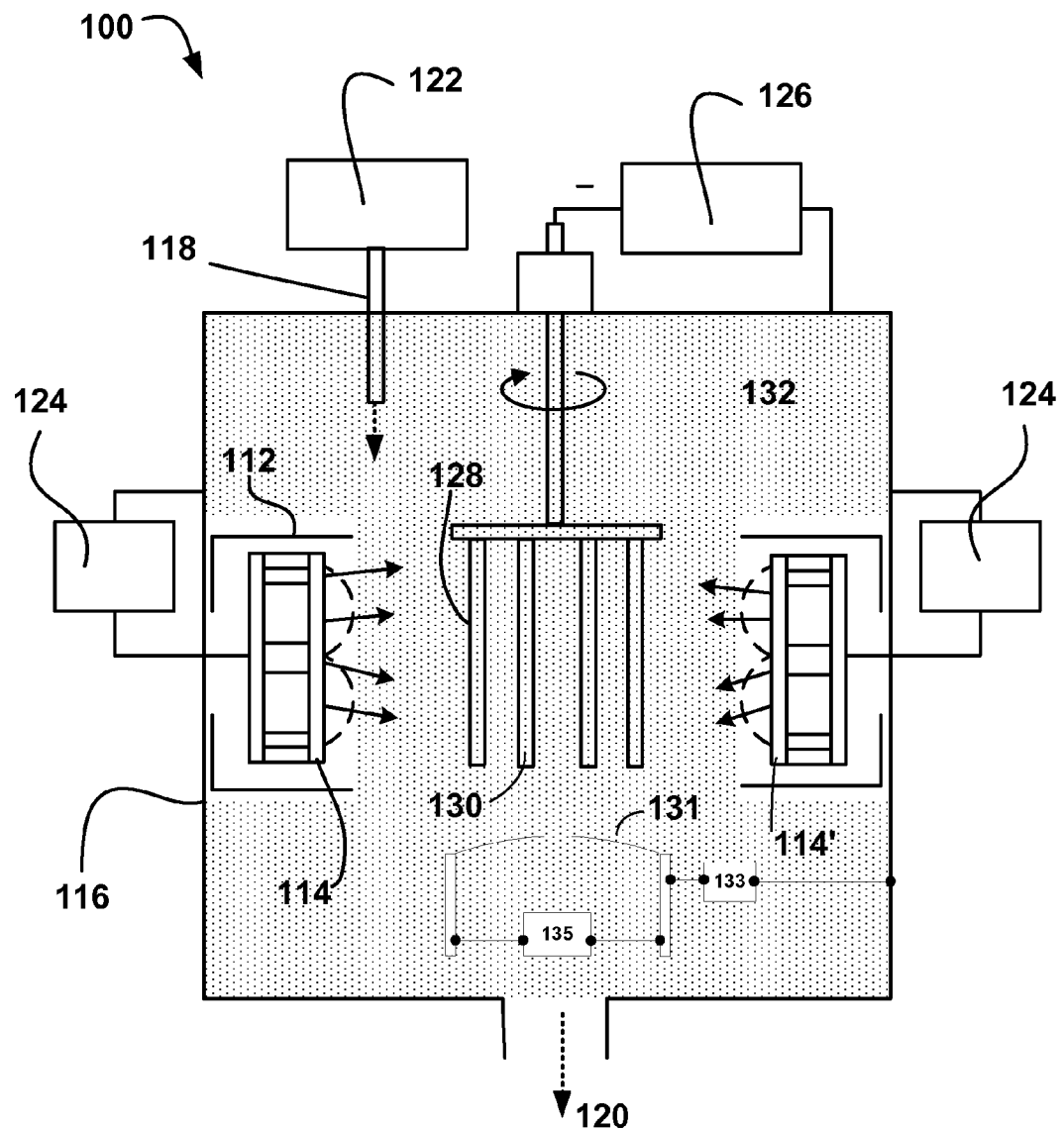
FIG. 1 is a schematic drawing of a plasma enhanced magnetron sputter vapor deposition system (PEMS)

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

One method to improve the temperature range and toughness of DLC coatings may be to dope the DLC coatings with a transition metal such as tungsten (W) or chromium (Cr), or a metalloid such as silicon (Si). These materials may form crystalline carbides with a grain size of less than 100 nanometers inside an amorphous DLC matrix; thereby forming a tungsten carbide (WC), chromium carbide (CrC) or silicon carbide (SiC) diamond-like carbon (DLC) nanocomposite coating, which may be expressed as WC-DLC, CrC-DLC and SiC-DLC, respectively. As used herein, a nanocomposite coating may be understood to be a coating that has at least two phases: one is a crystalline phase, with a grain size of 100 nanometers or less, generally in the range of and any increment between 1 nanometer to 100 nanometers, while the other phase is the amorphous phase.

In some cases, the included metal may not react with carbon to form carbide, or in the case of nitrogen, does not react with the nitrogen to form nitride. Copper is an example of one such metal. However, the copper may still provide the crystalline phase of the coating.

Physical vapor deposition (PVD), particularly magnetron sputtering, may be used to form amorphous DLC coatings, as well as nanocrystalline carbide-containing (e.g. WC, CrC and SiC) DLC nanocomposite coatings, and other metal doped DLC coatings. Referring to FIG. 1, there is shown a schematic of a plasma enhanced magnetron sputtering system 100 (PEMS), which is an improved version of conventional magnetron sputter deposition. In the PEMS process as shown, a tungsten carbide diamond-like carbon (WC-DLC) coating may be obtained with nanocrystalline tungsten carbide having a grain size of a few nanometers inside an amorphous diamond-like carbon (DLC) matrix.

The plasma enhanced magnetron sputtering system 100 may include one or more magnetrons 112, each supporting a sputter material target 114, in a vacuum chamber 116 having one or more inlet ports 118 and a pump 120 in fluid communication with the vacuum chamber 116. The inlet port(s) 118 may be in fluid communication with a precursor supply system 122, described below, as well as by an inert gas feed, which may be used in generating a global plasma 132 via the filament 131 and the discharge power supply 133 within the chamber 116.

The system 100 may also provide an energy source 124 for negatively biasing the magnetron 112, as well as an energy source 126 for negatively biasing the surface 128 of a substrate 130 to be coated. The energy source may be a voltage source and may be associated with circuitry. The energy sources may provide radio frequency (RF) or native voltage in the form of direct current (DC) power or pulse DC power. Where DC power or pulse DC power may be contemplated, a voltage control may be activated to negatively bias the respective component.

It may now be appreciated that PEMS amounts to one variation of magnetron sputter deposition techniques, which is a physical vapor deposition (PVD) process. According to the PEMS approach, when the vacuum chamber is filled with Ar gas to a pressure of a few millitorr and a negative voltage is applied to the magnetron, glow discharge plasma (magnetron plasma) is generated in front of the magnetron. Since plasma consists of ion, electrons and excited neutrals at various states, the negatively biased voltage on the target draws the ions from the plasma towards the target. Due to the high energy bombardment, the target material is ejected (sputtered) and hence deposited onto the surface of the part placed in front of the target. Normally, a low negative bias voltage (~50-100V) is applied to the part to draw Ar ions to densify the deposited film. During the sputter deposition of WC from a target 114, if graphite is sputtered from another target 114', WC-containing DLC (without hydrogen) can be obtained. If a carbonaceous gas is fed into the deposition system, hydrogen containing WC-DLC will be obtained on the surface of the parts 128.

When Ti targets are used on the magnetrons 114 and 114' and nitrogen is fed into the deposition system, a TiN coating forms on the surface of the parts 128. One may also now introduce another gas precursor that contains Si into the vacuum system. The coating thus formed is in the form of TiSiCN and is a nanocomposite coating that contains nanocrystalline TiCN in a matrix of amorphous SiCN. This coating is generally harder than typical TiN and exhibits relatively high erosion and corrosion resistance.

To further increase the plasma density, a characteristic of PEMS is that a filament 131 is now placed in the vacuum chamber. When it is heated by a power supply 135 to a relatively high temperature, electrons are emitted from the filament due to thermionic emission. A discharge power supply 133 is applied between the electron source and the vacuum chamber wall. As a result the electrons are accelerated to the wall. On the way to the chamber wall, the electrons experience collisions with the Ar atoms thereby resulting in ionization, or generating the global plasma. Using this technique, a much higher plasma density can be obtained. The high plasma density not only increases the sputtering rate of the solid target, but also increases the coating quality during the film growth due to the high flux of ion bombardment by the bias voltage source 126.

Figure 2:
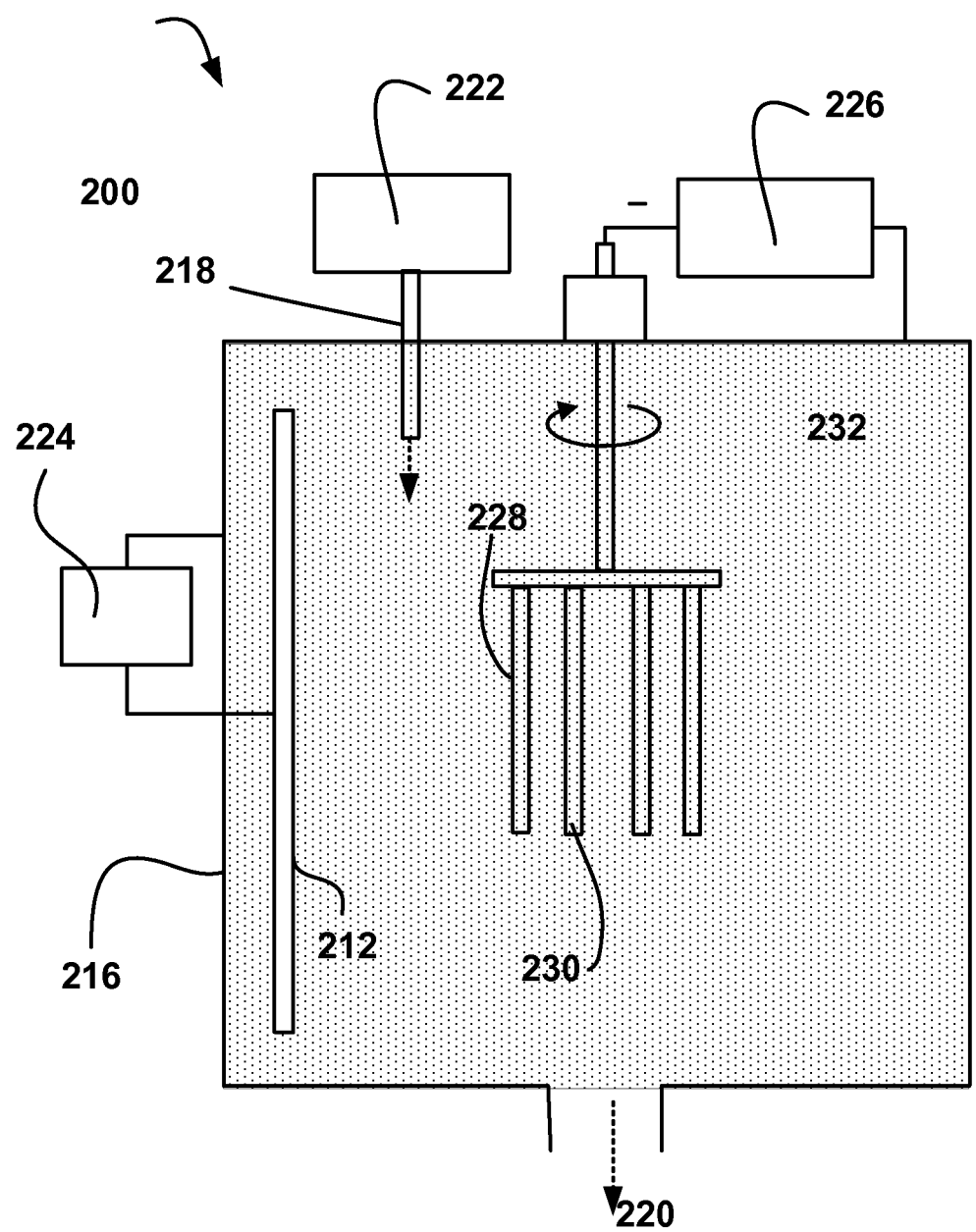
FIG. 2 is a schematic drawing of a plasma immersion ion deposition (PIID) system.

Another process which may be used to form DLC is plasma enhanced chemical vapor deposition (PECVD), and more particularly Plasma Immersion Ion Deposition (PIID). Referring to FIG. 2, there is shown a schematic of the PIID system. As can be seen, substrates 230 are located in a vacuum chamber 216. When a carbonaceous vapor, such as toluene or methanol, is fed in through inlet port 218 and RF power from energy source 224 is applied to an antenna 212, a plasma 232 may be generated. When a series of negative high voltage pulses (about 5 kV) are applied, carbonaceous ions are drawn to the substrates. As a result, a DLC coating may be deposited. In addition to the RF method, plasma may also be generated by microwave, hollow cathode discharge or filament-generated electron emission. In PIID, plasma often is generated by the high voltage itself due to its relative simplicity, which may be referred to as pulsed glow discharge. When a silicon (Si) precursor (e.g. silane or trimethylsilane) is added during the process, a silicon carbide (SiC) containing nanocomposite coating may be formed.

Figure 3:
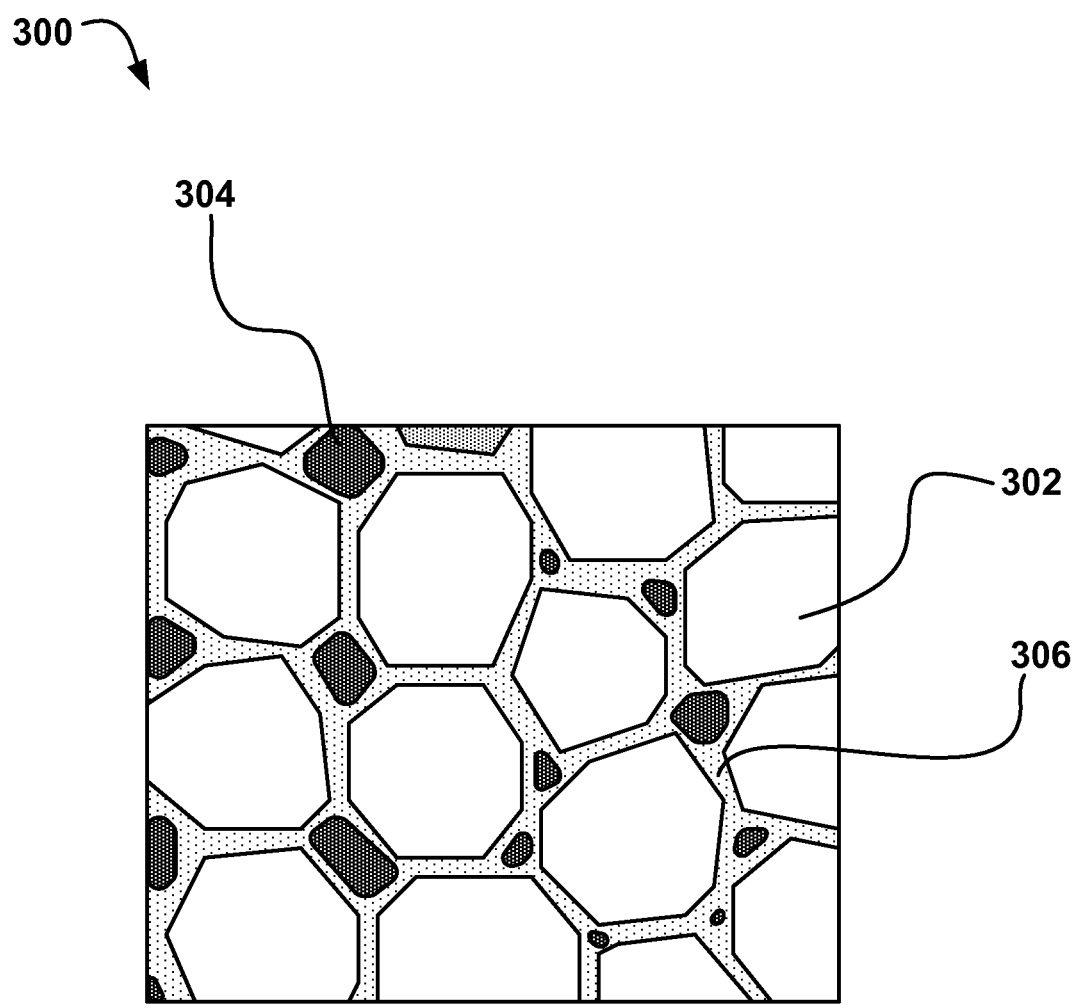
FIG. 3 is a schematic drawing showing a structure of a titanium silicon nitride (Ti—Si—N) coating.

Additional coatings which may be enhanced by the present invention include nitride-based nanocomposite coatings, which includes titanium-silicon-nitride (Ti—Si—N) coatings. For these coatings, the nanocrystalline phase may be understood to be provided by titanium nitride (TiN), while the amorphous phase may be understood to be provided by silicon nitride ($Si_3N_4$). To designate the crystalline and amorphous phases, the formula for the coating may be written as nc-TiN/a-$Si_3N_4$. Referring to FIG. 3, there is shown a schematic of the titanium-silicon-nitride (Ti—Si—N) nanocomposite coating. As shown in FIG. 3, the nanocomposite coating 300 comprises titanium nitride (TiN) nanocrystals 302, with or without titanium silicide ($TiSi_2$) nanocrystals 304, in an amorphous matrix of silicon nitride ($Si_3N_4$) 306.

Similar to this coating, many other nitride-based nanocomposite coatings (not the carbon-based) may be formed including zirconium-silicon-nitride (Zr—Si—N), titanium-aluminum-vanadium-silicon-nitride (Ti—Al—V—Si—N) and chromium-silicon-nitride (Cr—Si—N) coatings. Representative of these nitride-based nanocomposite coatings, titanium-silicon-nitride (Ti—Si—N) may be considered superhard (defined as H greater than or equal to 40 GPa), which is harder than either the titanium nitride (TiN) or silicon nitride ($Si_3N_4$). Titanium-silicon-nitride (Ti—Si—N) is also understood to have higher oxidation resistance than commonly used single phase coatings such as titanium nitride (TiN) and titanium-aluminum-nitride (Ti—Al—N). One of the major applications for these nitride coatings may be high speed, dry cutting of steel-based materials.

Still further coatings which may be enhanced by the present invention include titanium-silicon-carbonitride (Ti—Si—C—N) coatings, which may be made using a plasma enhanced magnetron sputtering (PEMS) process, as shown in FIG. 1. To produce this coating, titanium (Ti) may be provided by both target 114 and target 114', while silicon (Si), carbon (C), derived from trimethylsilane (TMS), and nitrogen (N), derived from nitrogen gas, are fed in to the vacuum chamber 116 via the inlet port(s) 118. Argon (Ar) is also used during the sputtering and may be introduced through inlet port(s) 118.

Titanium-silicon-carbonitride (Ti—Si—C—N) coating has a similar structure to titanium-silicon-nitride (Ti—Si—N) coating and may be characterized by the formula nc-$TiC_xN_{1-x}$/a-$SiC_yN_z$. The Ti—Si—C—N coating has certain advantages over the Ti—Si—N coating, particularly in that a much thicker coating (20-500 μm or microns) can be deposited with more uniform composition in a safer environment. Therefore, it can be used for large scale production. Ti—Si—C—N coating my be used to protect aero engine compressor blades against severe sand or solid particle erosion (SPE), land based turbine blades against water or liquid droplet erosion (LDE), and valves and pump components in oil/gas exploration and production against severe sand/mud abrasion.

Additional nitride-based nanocomposite coatings which may be enhanced by the present invention include coatings having a crystalline phase of nanocrystalline nitride which may comprise at least one of zirconium nitride, chromium nitride, hafnium nitride, vanadium nitride, tungsten nitride, tantalum nitride, titanium aluminum nitride and titanium aluminum vanadium nitride, and an amorphous phase which may comprise boron nitride.

Furthermore, carbonitride-based nanocomposite coatings which may be enhanced by the present invention include coatings having a crystalline phase of nanocrystalline carbonitride which may comprise at least one of titanium carbonitride, zirconium carbonitride, chromium carbonitride, hafnium carbonitride, vanadium carbonitride, tungsten carbonitride, tantalum carbonitride, titanium aluminum carbonitride and titanium aluminum vanadium carbonitride, and an amorphous phase which may comprise silicon carbonitride.

From a close examination of both DLC and nitride-based nanocomposite coatings, it may be understood that the strengthening mechanism is provided by the nanocrystalline carbide (e.g. tungsten carbide (WC)) in the case of the DLC based coating, or nanocrystalline nitride (e.g. titanium nitride (TiN)) in the case of the nitride based coating, with both embedded in an amorphous matrix which may be ceramic. If the carbide or nitride is replaced or supplemented with nanocrystalline diamond, the coating performance may be improved.

It is believed that a nanocomposite coating that contains nano-grained diamond has not been synthesized mainly due to the fact that hard coatings, such as tungsten carbide diamond-like carbon (WC-DLC) coating, titanium-silicon-nitride (nc-TiN/a-$Si_3N_4$) coating and titanium-silicon-carbonitride ($TiC_xN_{1-x}$/a-$SiC_yN_z$), are prepared using a PVD, CVD, or PECVD process in which each precursor element is in the gaseous phase or vapor phase. Furthermore, the differences in the formation temperature between diamond (>700° C.) and the others (25-350° C. for WC-DLC and 250-550° C. for Ti—Si—N) prevents the formation of diamond, and thus the formation of a nanodiamond-containing nanocomposite coating.

In order to overcome the foregoing problem, it has been found that a nanocomposite coating containing nanocrystalline diamond may be formed from precursor elements in a combination of at least a gas and/or vapor phase with a solid phase. Due to the incorporation of nanodiamond, the nanodiamond-containing nanocomposite coating is contemplated to be harder and have better toughness than nanocomposite coatings which do not contain nanocrystalline diamond, and therefore have better tribological properties. Compared with other diamond coatings, the nanodiamond-containing nanocomposite coating may be deposited at a relatively lower temperature and may be relatively tougher and hence can be used for many applications including intermittent machining of aluminum (Al) alloys and titanium (Ti) alloys (DLC based coating) and ferrous materials/substrates (nitrided based coating).

Nanodiamond powder herein may comprise particles having a grain size of 1-100 nanometers. Preferably, however, the grain size may be in the range of 1-100 nm. The nanodiamond may include particles which may be isolated from diamond detonation. Generally, the diamond grains may be unstable and may form micron sized clusters. The nanodiamond is also one that typically has diamond cubic type lattices. The surface of the diamond may also be functionalized to include various organic groups, such as hydroxyl (—OH), amine (—$NH_2$), carboxylic acid (—COOH) and/or ketone (—CO—).

However, the mere use of nanodiamond powder may not provide a preferred coating. For example, direct application of nanodiamond particles to a substrate surface in an ambient environment, together with a subsequent heat treatment or curing process, is not understood to provide a relatively durable coating and, furthermore, the formed coating is not understood to comprise a composite coating having at least two phases.

Additionally, in a vacuum deposition process, simple spray application of the nanodiamond particles is not understood to result in the formation of a nanocomposite coating containing nanodiamond as the particles, particularly as the particles may be carried away by the vacuum pump.

Figure 4:
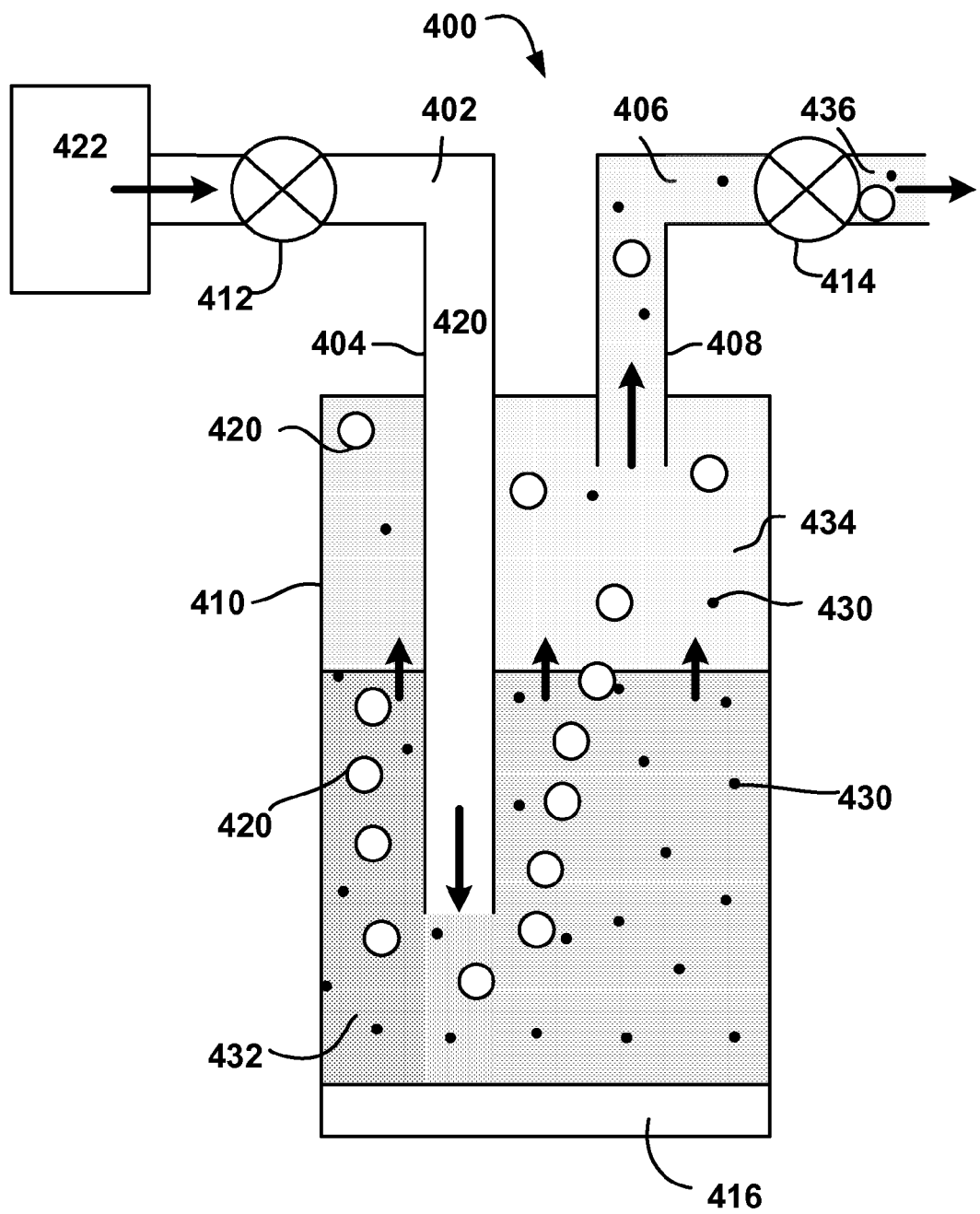
FIG. 4 is a schematic drawing of a precursor system for vapor deposition, including physical or chemical vapor deposition.

In order to form a nanocomposite coating containing nanocrystalline diamond of the present invention (i.e. a grain size of ≦100 nm) reference is now made to FIG. 4. Referring to FIG. 4, there is shown a schematic drawing of a precursor supply system 400 for vapor deposition, which may include physical or chemical vapor deposition.

As shown, precursor supply system 400 may include an inlet fluid flow passage 402 which may be provided by a tubular conduit 404 such as provided by a pipe, as well as an outlet fluid flow passage 406, which also may be provided by a tubular conduit such as provided by a pipe. Fluid flow within the inlet passage 402 to an evaporator tank 410 and the outlet passage 406 from the evaporator tank 410 may be controlled by inlet valve 412 and outlet valve 414, respectively. Inlet passage 402 may be in fluid communication with and configured to receive a gas 420 (e.g. argon and/or nitrogen) from gas source 422, while outlet passage 406 may be in fluid communication with and configured to provide a precursor comprising vapor, gas and solid particles to a vapor deposition system, such as vacuum chamber 16 shown in FIG. 1.

For nanocrystalline diamond-containing DLC (ND-DLC) coatings, nanodiamond particles 430 can be dispersed in a liquid 432 such as carbon containing liquid, which may comprise one or more hydrocarbon compounds, such as toluene, and/or one or more alcohol compounds, such as methanol. The liquid 432 may also comprise one or more silicon containing compounds such as one or more of silane ($SiH_4$), methylsilane (MS; $CH_3SiH_3$), dimethylsilane (2MS or DMS; $(CH_3)_2$—$SiH_2$), trimethylsilane (3MS; $(CH_3)_3$—SiH), tetramethylsilane (TMS; $(CH_3)_4$—Si), hexamethyldisilazane (HMDS or HMDSN; $(CH_3)_3$—$SiNHSi(CH_3)_3$) and hexamethyldisiloxane (HMDSO; $O[Si(CH_3)_3]_2$) which are silicon carbide (SiC) based precursors.

The nanodiamond particles 430 may be dispersed in the liquid in a range of and any increment between 1 part-per-trillion to 5 parts-per-thousand by weight of the liquid. More particularly, the nanodiamond particles 430 may be dispersed in the liquid in a range of and any increment between 1 part-per-million to 1000 parts-per-million by weight of the liquid, and even more particularly in a range of and any increment between 10 parts-per-million to 100 parts-per-million by weight of the liquid.

The liquid 432 may then be converted to a vapor 434 by evaporation to provide a precursor 436 comprising nanodiamond particles 430 dispersed in a gaseous (vapor) medium 434. Evaporation may be performed at 20° to 25° C. (i.e. room temperature), or may be performed above 25° C. by heating the liquid 432 with a heat source 416.

The precursor 436 may then be fed, for example, into a PVD system (FIG. 1) or PIID system (FIG. 2) and converted to a plasma for the deposition of a nanocomposite DLC coating containing nanodiamond. The deposition process used to provide the nanocomposite DLC coating containing nanodiamond may be essentially the same as for producing the DLC coating without the nanodiamond.

Nanocomposite DLC coatings containing nanodiamond may or may not contain one or more transition metals (e.g. tungsten (W), chromium (Cr)) and/or one or more metalloids (e.g. silicon (Si)). Examples of nanocomposite DLC coatings containing nanodiamond include tungsten carbide DLC (WC-DLC), chromium carbide DLC (CrC-DLC) and/or silicon carbide (SiC-DLC) coatings. The coating thus obtained may be a nanocomposite DLC coating containing nanocrystalline diamond, with or without a transition metal and/or metalloid (such as with or without WC, CrC and/or SiC) in a matrix of amorphous DLC.

For nanocrystalline diamond-containing Ti—Si—C—N coatings (ND-TiSiCN), nanodiamond particles 430, along with a gas 420, such as comprising an inert gas (e.g. argon (Ar)) and a reactive gas (e.g. nitrogen (N)), can be dispersed in a liquid 432 such as one or more of silane ($SiH_4$), methylsilane (MS), dimethylsilane (2MS or DMS), trimethylsilane (3MS or TMS), tetramethylsilane (TMS), hexamethyldisilazane (HMDS or HMDSN), and hexamethyldisiloxane (HMDSO), which are silicon (Si) containing precursors. The liquid 432 may then be converted to a vapor 434 by evaporation to provide a precursor 436 comprising nanodiamond particles 430 dispersed in a gaseous medium (vapor 434 and gas 420). Evaporation of liquid 432 may be performed at 20° to 25° C. (i.e. room temperature), or may be performed above 25° C. by heating the liquid 432 with a heat source 416.

The gaseous precursor 436 may then be fed, for example, into a PVD system (FIG. 1) and converted to a plasma for the deposition of a nanocomposite coating containing nanodiamond. The deposition process used to provide the nanocomposite coating containing nanodiamond, which may be a nitride-based coating, may be essentially the same as for producing the coating without the nanodiamond. Nitride-based coatings containing nanodiamond may or may not contain one or more transition metals and/or one or more metalloids. Examples of nanocomposite nitride coatings containing nanodiamond include titanium nitride (TiN), titanium-silicon-nitride (Ti—Si—N) or titanium-silicon-carbo-nitride coating (Ti—Si—C—N) coatings. The coating thus obtained may be a nanocomposite nitride coating containing nanocrystalline diamond and nanocrystalline TiCN in a matrix of amorphous SiCN.

Figure 5:
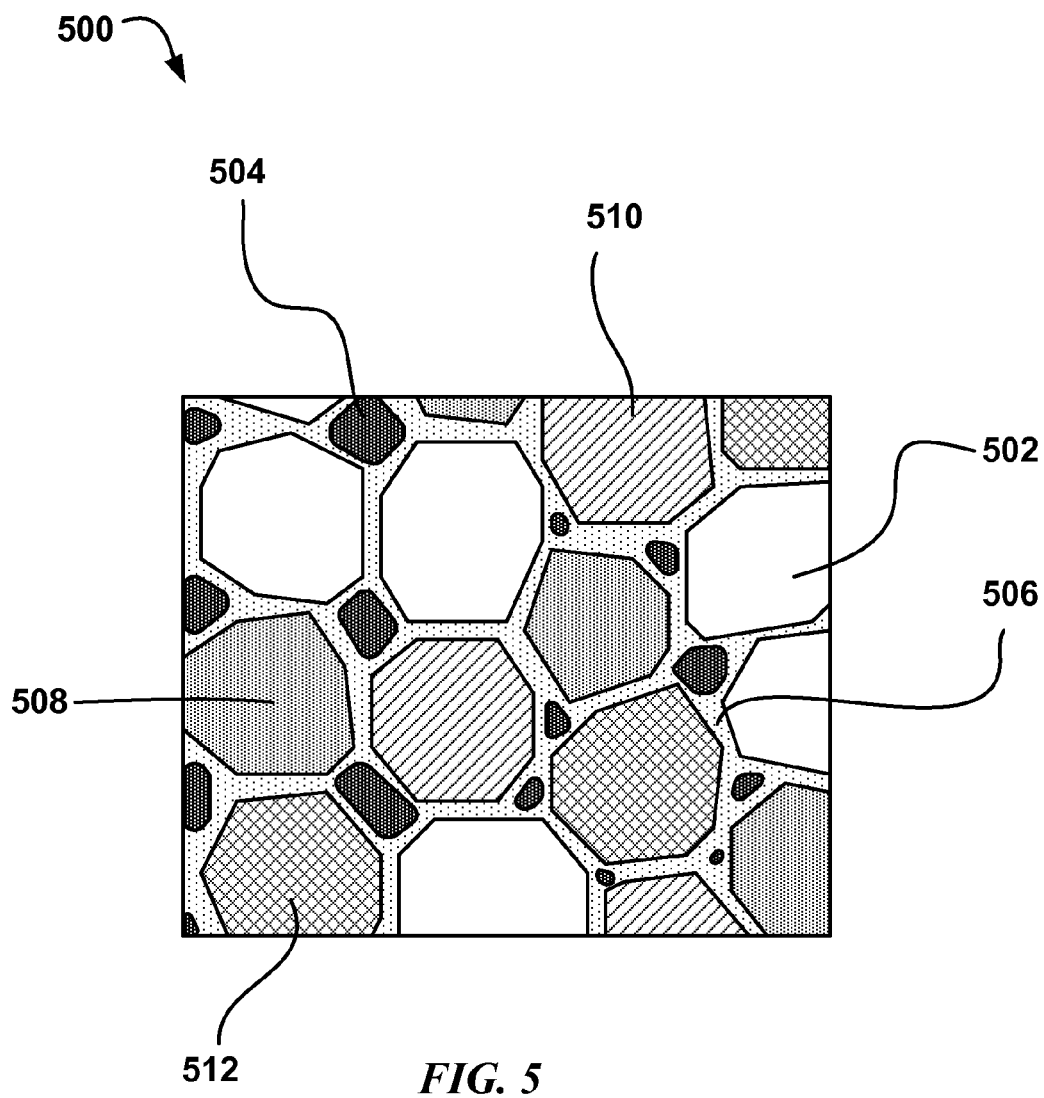
FIG. 5 is a schematic drawing showing a structure of a coating of the present invention.

As illustrated in FIG. 5, a resulting nanocomposite coating 500 of the present invention may include metal compounds (such as metal nitride nanocrystals 502, metal silicide nanocrystals 504, metal carbide nanocrystals 508, metal carbonitride nanocrystals 510), and diamond nanocrystals 512 (grain size of ≦100 nm) which may be embedded in an amorphous matrix 506, such as an amorphous matrix of carbon, diamond-like carbon, amorphous nitride (e.g. silicon nitride $Si_3N_4$, boron nitride (BN)), and amorphous carbonitride (e.g. silicon carbonitride SiCN).

It is noted that in either case (ND-DLC or ND-TiSiCN), the nanodiamond particles can be dispersed in the liquid 432 with minimal or no aggregation. For example, if the nanodiamond particles agglomerate in the liquid to produce agglomerations of nanodiamond particles, the agglomerations may have a maximum size of less than or equal to 10 microns. The gaseous precursor 436 may be used as if there were no nanodiamond particles given the particle size is so small. The gaseous precursor 436 may be fed into the vacuum chamber and vacuum system using the traditional way such a gas mass flow controller with little or slight heating.

It should also be noted that the gaseous precursor 436 may be converted to a plasma by at least one of radio frequency discharge, microwave discharge, direct current discharge, pulse direct current discharge, hollow cathode discharge, electron impact ionization via hot filament thermionic emission, arc discharge and magnetron induced discharge.

It should also be noted that the vapor deposition process may comprise at least one of magnetron sputter deposition, cathodic arc evaporation deposition, electron beam evaporation deposition, radio frequency discharge deposition, microwave discharge deposition and pulsed direct current discharge deposition.

It should be mentioned that diamond may get oxidized at about 800° C. and graphitization may occur at approximately 1200° C. in air. However, the deposition processes discussed herein generally take place in vacuum and at processing temperatures equal to or lower than 550° C. As the melting temperature for diamond is higher, the diamond particles are contemplated to remain in the solid form in the deposition process plasma. Some of the diamond particles may be ionized (losing electrons) during the deposition processes due to collisions with electrons and/or charge exchange with argon (Ar) ions or excited argon (Ar) atoms which is expected to improve the quality of the coating.

Exemplary applications for a ND-DLC nanocomposite coating may include (1) coating on automotive components requiring low friction and low wear; (2) coating on cutting tools for machining, such as Al and Al alloys particularly for auto industry, and Ti alloys particularly for the aerospace industry; (3) coating on electronic parts (e.g. integrated circuits) for anti-tampering, particularly against acid etching and ion milling, and particularly for military applications; and (4) coating on tube/pipe inner surfaces for increased resistance to erosion, abrasion, cavitation and corrosion for petroleum, natural gas, chemicals and water transmission; and (5) coating on glass or polymeric materials for increase resistance to erosion, abrasion and wear against sand and dust for aircraft windshields and automobile windshields.

Exemplary applications for a ND-Ti—Si—C—N nanocomposite coatings may include (1) solid particle erosion resistant coatings for aircraft engine compressor blades; (2) solid particle erosion resistant coatings for gas turbine blades for power generation; (3) solid particle erosion resistant coatings for compressor/blower blades; (4) liquid droplet erosion resistant coatings for steam turbine blades; (5) cavitation erosion resistant coatings for hydraulic turbine blades and equipment components; (6) coating on cutting tools for server, high speed, dry machining of ferrous materials; (7) oil/natural gas drilling equipment components including drill bits and mud pumps; and (8) coating on various components against dry sliding wear.

While a preferred embodiment of the present invention(s) has been described, it should be understood that various changes, adaptations and modifications can be made therein without departing from the spirit of the invention(s) and the scope of the appended claims. The scope of the invention(s) should, therefore, be determined not with reference to the above description, but instead should be determined with reference to the appended claims along with their full scope of equivalents. Furthermore, it should be understood that the appended claims do not necessarily comprise the broadest scope of the invention(s) which the applicant is entitled to claim, or the only manner(s) in which the invention(s) may be claimed, or that all recited features are necessary.

What is claimed is:
1. A method of coating a substrate comprising:
providing a substrate;
dispersing nanodiamond particles and a reactive gas in a liquid to provide a coating precursor, wherein the particles have a grain size in a range between and including 1 to 100 nanometers;
converting the liquid of the coating precursor to a vapor to provide a gaseous medium of the vapor and the reactive gas, wherein the nanodiamond particles are dispersed in the gaseous medium;

introducing the nanodiamond particles, the vapor and the reactive gas of the coating precursor to a vapor deposition process; and operating the vapor deposition process to produce a nanocomposite coating on the substrate using the nanodiamond particles, the vapor and the reactive gas, wherein the nanocomposite coating comprises the nanodiamond particles embedded in an amorphous matrix.

2. The method of claim 1 wherein:
the nanodiamond particles have a grain size in a range between and including 1 to 10 nanometers.

3. The method of claim 1 wherein:
the nanodiamond particles are dispersed in the liquid in a range between and including 1 part-per-trillion to 5 parts-per-thousand by weight of the liquid.

4. The method of claim 1 wherein:
the nanodiamond particles are dispersed in the liquid in a range between and including 1 part-per-million to 1000 parts-per-million by weight of the liquid.

5. The method of claim 1 wherein:
the nanodiamond particles are dispersed in the liquid in a range between and including 10 parts-per-million to 100 parts-per-million by weight of the liquid.

6. The method of claim 1 wherein:
the nanodiamond particles agglomerate in the liquid to produce agglomerations of nanodiamond particles; and
the agglomerations have a maximum size of equal to or less than 10 microns.

7. The method of claim 1 wherein:
the coating precursor is a carbon containing precursor.

8. The method of claim 1 wherein:
the liquid comprises a hydrocarbon compound.

9. The method of claim 8 wherein:
the hydrocarbon compound is an aromatic hydrocarbon.

10. The method of claim 1 wherein:
the liquid comprises an organic alcohol.

11. The method of claim 10 wherein:
the alcohol compound comprises methanol.

12. The method of claim 1 wherein:
the coating precursor is a silicon containing precursor.

13. The method of claim 1 wherein:
the liquid comprises a silicon containing liquid.

14. The method of claim 13 wherein:
the silicon containing liquid comprises at least one of silane, methylsilane, dimethylsilane, trimethylsilane, tetramethylsilane, hexamethyldisilazane and hexamethyldisiloxane.

15. The method of claim 1 wherein:
the vapor deposition process comprises a physical vapor deposition process.

16. The method of claim 15 wherein:
the physical vapor deposition process comprises a plasma-enhanced physical vapor deposition process.

17. The method of claim 1 wherein:
the vapor deposition process comprises a chemical vapor deposition process.

18. The method of claim 17 wherein:
the chemical vapor deposition process comprises a plasma-enhanced chemical vapor deposition process.

19. The method of claim 1 wherein:
the vapor deposition process comprises at least one of magnetron sputter deposition, cathodic arc evaporation deposition, electron beam evaporation deposition, radio frequency discharge deposition, microwave discharge deposition and pulsed direct current discharge deposition.

20. The method of claim 1 wherein:
the nanocomposite coating comprises amorphous carbon.

21. The method of claim 20 wherein:
the amorphous carbon comprises diamond-like carbon.

22. The method of claim 21 wherein:
the diamond-like carbon contains hydrogen.

23. The method of claim 21 wherein:
the diamond-like carbon does not contain hydrogen.

24. The method of claim 1 wherein:
the nanocomposite coating comprises at least one of tungsten carbide, chromium carbide and silicon carbide.

25. The method of claim 1 wherein:
the nanocomposite coating comprises at least one of nanocrystalline nitride and amorphous nitride.

26. The method of claim 25 wherein:
the nanocrystalline nitride comprises at least one of titanium nitride, zirconium nitride, chromium nitride, hafnium nitride, vanadium nitride, tungsten nitride, tantalum nitride, titanium aluminum nitride and titanium aluminum vanadium nitride.

27. The method of claim 26 wherein:
the amorphous nitride comprises at least one of silicon nitride and boron nitride.

28. The method of claim 1 wherein:
the nanocomposite coating comprises at least one of nanocrystalline carbonitride and amorphous carbonitride.

29. The method of claim 28 wherein:
the nanocrystalline carbonitride comprises at least one of titanium carbonitride, zirconium carbonitride, chromium carbonitride, hafnium carbonitride, vanadium carbonitride, tungsten carbonitride, tantalum carbonitride, titanium aluminum carbonitride and titanium aluminum vanadium carbonitride.

30. The method of claim 29 wherein:
the amorphous carbonitride comprises silicon carbonitride.

31. The method of claim 1 wherein:
the nanocomposite coating comprises nanocrystalline nitride and a metal that is not a nitride or carbide former.

32. The method of claim 31 wherein:
the nanocrystalline nitride comprises at least one of titanium nitride, zirconium nitride, chromium nitride, hafnium nitride, vanadium nitride, tungsten nitride, tantalum nitride, titanium aluminum nitride and titanium aluminum vanadium nitride.

33. The method of claim 32 wherein:
the metal that is not a nitride or carbide former comprises copper.

34. The method of claim 1 wherein:
the nanocomposite coating comprises nitride, carbonitride and a metal that is not a nitride or carbide former.

35. The method of claim 1 wherein:
the nanocomposite coating comprises the nanodiamond particles dispersed in an amorphous carbon matrix.

36. The method of claim 1 wherein:
the liquid of the coating precursor is converted to a vapor prior to introducing the coating precursor to the vapor deposition process.

37. The method of claim 36 wherein:
the liquid is converted to a vapor at a temperature of 20° to 25° C.

38. The method of claim 37 wherein:
the liquid is converted to a vapor while heating the liquid to a temperature above 25° C.

39. The method of claim 38 wherein:
the vapor is converted to a plasma during the vapor deposition process.

40. The method of claim 39 wherein:
the plasma is generated by at least one of radio frequency discharge, microwave discharge, direct current discharge, pulse direct current discharge, hollow cathode discharge, electron impact ionization via hot filament thermionic emission, arc discharge and magnetron induced discharge.

* * * * *